(12) United States Patent
Kitano

(10) Patent No.: US 7,730,431 B2
(45) Date of Patent: Jun. 1, 2010

(54) DESIGN METHOD, DESIGN APPARATUS, AND COMPUTER PROGRAM FOR SEMICONDUCTOR INTEGRATED CIRCUIT

(75) Inventor: Tomohiro Kitano, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 836 days.

(21) Appl. No.: 11/281,590

(22) Filed: Nov. 18, 2005

(65) Prior Publication Data
US 2006/0112362 A1 May 25, 2006

(30) Foreign Application Priority Data
Nov. 22, 2004 (JP) ............................. 2004-337858

(51) Int. Cl.
G06F 17/50 (2006.01)
(52) U.S. Cl. ................... 716/1; 716/7; 716/8; 716/9; 716/10; 716/11
(58) Field of Classification Search ............... 716/7–13, 716/1, 17
See application file for complete search history.

(56) References Cited
U.S. PATENT DOCUMENTS
2003/0237072 A1* 12/2003 Melli et al. ................... 716/19

2004/0003366 A1* 1/2004 Suzuki ........................ 716/11
2004/0243963 A1* 12/2004 Srinivasan et al. ............ 716/10
2006/0080629 A1* 4/2006 Sampath ..................... 716/10

FOREIGN PATENT DOCUMENTS

| JP | 5-326704 A | 12/1993 |
|---|---|---|
| JP | 9-246388 A | 9/1997 |
| JP | 10-21272 A | 1/1998 |
| JP | 10-74842 A | 3/1998 |
| JP | 10-92941 A | 4/1998 |
| JP | 10-189750 A | 7/1998 |
| JP | 2800781 B2 | 7/1998 |
| JP | 11-111846 A | 4/1999 |
| JP | 2001-68551 A | 3/2001 |
| JP | 3256597 B2 | 11/2001 |
| JP | 3433025 B2 | 5/2003 |

OTHER PUBLICATIONS

Machine Translation of Japanese Publiccation No. 5-326704 to Suzuki Goro, Semiconductor Layout Designing Method and Device Thereof, date of publication: Oct. 12, 1993, 1 cover page and 24 content pages.*

* cited by examiner

Primary Examiner—Paul Dinh
(74) Attorney, Agent, or Firm—Sughrue Mion, PLLC

(57) ABSTRACT

The relative placement orders of cells with respect to circuit diagram information received are automatically determined, and the cells are automatically placed in relative positional relationships according to the placement orders given to the circuit diagram information.

10 Claims, 21 Drawing Sheets

US 7,730,431 B2

DESIGN METHOD, DESIGN APPARATUS, AND COMPUTER PROGRAM FOR SEMICONDUCTOR INTEGRATED CIRCUIT

FIELD OF THE INVENTION

The present invention relates to a technique for design of a semiconductor integrated circuit. More specifically, the invention relates to a method, an apparatus, and a computer program suitable for being applied to a standard-cell based design.

BACKGROUND OF THE INVENTION

Conventionally, as a method of designing layout of semiconductor integrated circuits, there are three types of design methods: a gate array based design, a full custom design, and a standard-cell based design.

In the gate array based design, transistors that have been regularly arranged beforehand are designed only by a change in interconnection connection. For this reason, it cannot be applied to a semiconductor such as a memory product, in which the degree of integration is pursued.

In the full custom design, a high-performance semiconductor can be designed. However, since a designer manually arranges cells on physical coordinates while viewing a layout pattern, a long period and effort are required for development. Thus, it cannot be applied to a semiconductor that is to be designed in a short period.

The standard-cell based design is the method in which standard-cells are automatically placed. Thus, it is suitable for a semiconductor that is to be designed in a short period, and has been used a lot in recent years. In the conventional automatic placement method of standard-cells, however, the cells are simply placed according to a certain rule, in principle. For this reason, it is not suitable for design in which placement positions of individual cells are optimized to extract their performances. Accordingly, it is difficult to perform design that attaches importance to circuit quality, according to the design method using the standard-cell method. Further, using a technique referred to as grouping, it is possible to define a plurality of cells as one group, and to execute automatic placement of the cells that belong to that group to be close to each other. However, a relative positional relationship for placement of the cells in the same group cannot be specified. For this reason, the placement orders of the cells desired by a circuit designer could not be obtained, so that an optimized circuit could not be designed.

Incidentally, as documents about automated design for a timing constraint, optimized placement, Patent Document 1, for example, proposes a placement method in which a logic cell associated with a critical path and close to input and output terminals of the group are arranged in a more outer divided region, while a logic cell located distant from the input and output terminals is arranged in a more inner divided region. With this placement method, automated placement reflecting a circuit configuration becomes possible, and a design period is reduced while satisfying a timing constraint condition. Patent Document 2 discloses a design method in which a net list indicating a connecting relationship between flip-flops associated with the timing constraint is generated, layout design is performed after arranging positions of the flip-flops are determined according to this net list, thereby securing satisfaction of the timing constraint of an LSI in a short processing time. Patent Document 3 discloses a method of obtaining placement design with less nonuniformity in the distribution density of interconnection in the placement design using the standard-cell method. Patent Document 4 describes a method including a step in which a module is divided in cell placement regions, in each of which internal cells are arranged in a row, and the allotment into the cell row of the internal cells is optimized, thereby optimizing and placement in the cell row of the internal cells. Patent Document 5 discloses a method in which a change in design such as cell insertion, cell exchange, or cell deletion is captured in the course of automated placement design, timing determination, design change, and formation of an placement line loop are performed, thereby performing automatic modification processing in a short period. Further, Patent Document 6 discloses a method in which even in an LSI including a lot of hard macros, high-quality module placement can be implemented without using manpower.

[Patent Document 1]
  Japanese Patent Kokai Publication No. JP-P2001-68551A

[Patent Document 2]
  Japanese Patent Kokai Publication No. JP-A-10-74842

[Patent Document 3]
  Japanese Patent Kokai Publication No. JP-A-10-189750

[Patent Document 4]
  Japanese Patent No. 2800781

[Patent Document 5]
  Japanese Patent No. 3256597

[Patent Document 6]
  Japanese Patent No. 3433025

SUMMARY OF THE DISCLOSURE

When the design that attaches importance to the circuit quality is performed in the conventional automated design method or the like using standard-cells, followings cannot be performed:
  placement of the cells in a circuit for which the same timing is required
  separation between a critical path and unimportant paths
  simultaneous design of a circuit group constituted from a plurality of circuits such as memory input and output circuits to which same characteristics need to be given
  design of a circuit such as an amplifier circuit, to which a symmetrical characteristic needs to be given The reason for this is that in the automated design method based on standard-cells, the cells are automatically placed according to a certain rule, so that the cells are arranged in a positional relationship different from that intended by the designer who grasps the characteristics of the circuit.

In a circuit shown in FIG. 14, for example,
  cell placement that gives the same characteristics to three circuits is necessary in a portion indicated by reference numeral 141,
  an element Q indicated by reference numeral 142 needs to be placed in a position close to all elements D1, D2, and D3 in the portion 141,
  a portion indicated by reference numeral 143 is a circuit having a margin of the characteristics thereof, so that the portion 143 may be arranged in a position with lower priority than the positions of other cells.

An example will be shown in FIG. 17 in which cell placement of this circuit is performed using an algorithm of the standard-cell based design that reduces a total interconnection length, which is the current mainstream. Reference numerals 171, 172, 173, 174, and 175 in FIG. 17 correspond to reference numerals 141, 142, 143, 144, 145 in FIG. 14, respectively. In this algorithm, separation between the portion 141 and the portion 143 in FIG. 14 cannot be performed. Accordingly, the portion 143 with lower priority gets into the portion 141 with higher priority, and individual cells are arranged as shown in the portions indicated by reference numerals 171 and 173 in FIG. 17. For this reason, cell placement is performed in which the characteristics of the three circuits in the portion 141 become different to one another.

Further, the elements D1, D2, and D3 in the portion 141 and the element Q in the portion 142 in FIG. 14 are arranged as in the portion 171 and a portion 172 in FIG. 17. Thus, the path of an interconnection 'b' indicated by reference numeral 145 in FIG. 14 connecting those becomes lengthy as that of an interconnection indicated by reference numeral 175 in FIG. 17, thereby leading to degrading of the circuit quality and becoming an obstacle when other interconnections are arranged.

An interconnection 'a' indicated by reference numeral 144 in FIG. 14 is also arranged as an interconnection indicated by reference numeral 174 in FIG. 17. Hence, uniform inputs are not provided for the three circuits, so that the same problems will arise.

The present invention disclosed in the present application is generally configured as follows.

In a design of the present invention, using means for automatically determining the relative placement order of a cell according to a priority frame added to circuit diagram information, the cell is arranged in a desired relative positional relationship according to the relative placement order of the cell held by the circuit diagram information.

A method for design of a semiconductor integrated circuit using a computer, includes:

a first step of receiving circuit diagram information and giving a relative placement order of a cell to the circuit diagram information; and a second step of performing automatic placement of the cell with a relative positional relationship between cells according to the placement order given to the circuit diagram information.

A method for design of a semiconductor integrated circuit using a computer, according to other aspect of the present invention includes:

a first step of receiving circuit diagram information and giving to the circuit diagram information a group number of a cell together with relative placement information on the cell; and a second step of performing placement of a plurality of cells having the same group number with a relative positional relationship according to an placement order given to the circuit diagram information.

An apparatus for design of a semiconductor integrated circuit, according to one aspect of the present invention includes:

a unit for receiving circuit diagram information and giving the relative placement order of a cell to the circuit diagram information; and a unit for automatically arranging the cell in a relative positional relationship according to the placement order given to the circuit diagram information. In the present invention, the unit for giving the relative placement order of a cell may be so configured that when determining the relative placement order of the cell, search for an element is performed for each of a plurality of regions obtained by division of the circuit diagram information in a specified direction, and the placement number of the cell is given when the element is found. Alternatively, in the present invention, the unit for giving the relative placement order of a cell may be so configured that when determining the relative placement order of the cell, priority frames set in the circuit diagram information are used, and the relative placement order of the cell is determined in an order of priority of the priority frames.

An apparatus for design of a semiconductor integrated circuit, according to another aspect of the present invention includes:

a unit for giving the relative placement order of the cell gives to the circuit diagram information a group number of a cell together with relative placement information on the cell; and a unit for performing automatic placement of a plurality of cells having the same group number with a relative positional relationship according to an placement order given to the circuit diagram information.

A computer program, according to another aspect of the present invention, is the program for causing a computer constituting an apparatus for design of a semiconductor integrated circuit to execute:

first processing of receiving circuit diagram information and giving the relative placement order of a cell to the circuit diagram information; and second processing of performing automatic placement of the cell in a relative positional relationship according to the placement order given to the circuit diagram information.

A computer program, according to another aspect of the present invention, is the program for causing a computer constituting an apparatus for design of a semiconductor integrated circuit to execute:

first processing of receiving circuit diagram information and giving to the circuit diagram information the group number of a cell together with relative placement information on the cell; and second processing of performing automatic placement of a plurality of cells having the same group number with a relative positional relationship according to an placement order given to the circuit diagram information.

The meritorious effects of the present invention are summarized as follows.

According to the present invention, in an automated design using standard-cells or the like, just by performing brief specification of placement of an element in the form of a priority frame at the time of circuit design, relative placement orders when automatically arranging cells can be determined at the time of the circuit design. High-quality layout that allows a higher speed of a critical path and supply of signals of the same speed to a plurality of input interconnections can be thereby prepared in a short time.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
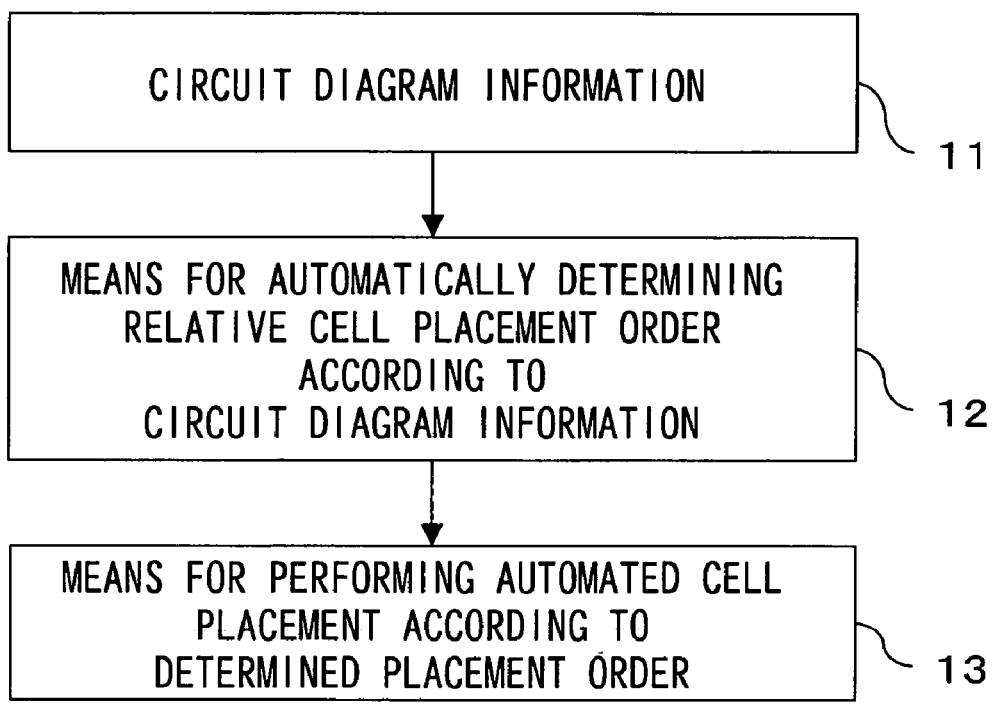
FIG. 1 is a diagram for explaining a configuration of a first embodiment of the present invention.

Next, embodiments of the present invention will be described in detail with reference to FIGS. 1 through 5. FIG. 1 is a diagram for explaining a design method according to an embodiment of the present invention. Referring to FIG. 1, in the present embodiment, circuit diagram information 11 (including the information of circuit net-list and the information of circuit elements) with a priority frame that will be described later, for example, added thereto is prepared as circuit diagram information.

There is provided means (a unit) for automatically determining relative cell placement order 12 for automatically determining the relative placement order of a cell based on the circuit diagram information 11 in the data processing device (not shown) for executing an automatic layout design. There is also provided means (a unit) for performing automated cell placement 13, which actually performs automatic placement of the cells, while maintaining a relative positional relationship between the cells according to information on the placement orders of the cells determined by the means 12.

Figure 3:
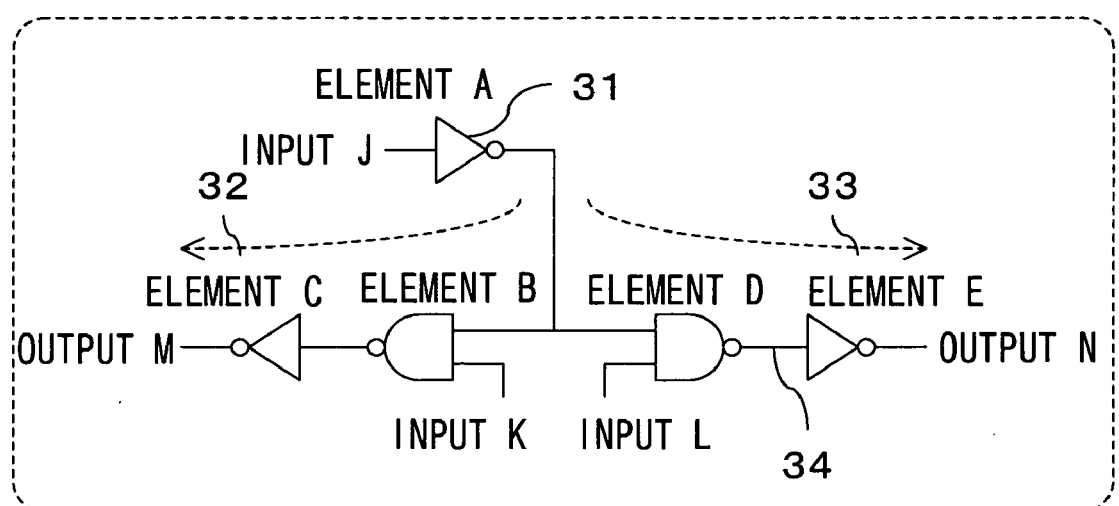
FIG. 3 shows circuit diagram information for explaining the first embodiment of the present invention.

It is assumed that as the circuit diagram information 11, a circuit as shown in FIG. 3, for example, is designed. In the circuit in FIG. 3, a timing for a path 32 extending from an input J to an output M (including elements A, B, and C) and a timing for a path 33 extending from the input J to an output N (including the element A, and elements D and E) need to be matched completely. Thus, a circuit designer usually conceives the placement orders of the cells as shown in FIG. 5.

Figure 5:
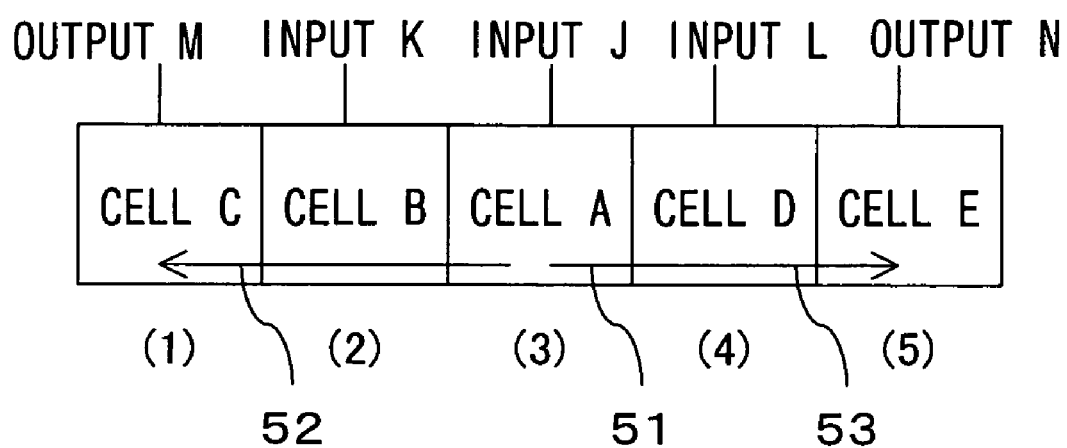
FIG. 5 is a diagram showing a result in which cells have been automatically placed based on the circuit diagram information in FIG. 3 in the first embodiment of the present invention.

FIG. 5 shows the placement orders of the cells where the quality of the circuit has been optimized, which is a design goal set by the circuit designer. In the middle of one row of standard-cells (cell row), a cell A (connected to the input J) is arranged. On its left side, cells B and C are arranged, and on its right side, cells D and E are arranged. FIG. 5 is a diagram showing a result in which the cells have been automatically placed according to the present embodiment, based on the circuit diagram information in FIG. 3.

Figure 2:
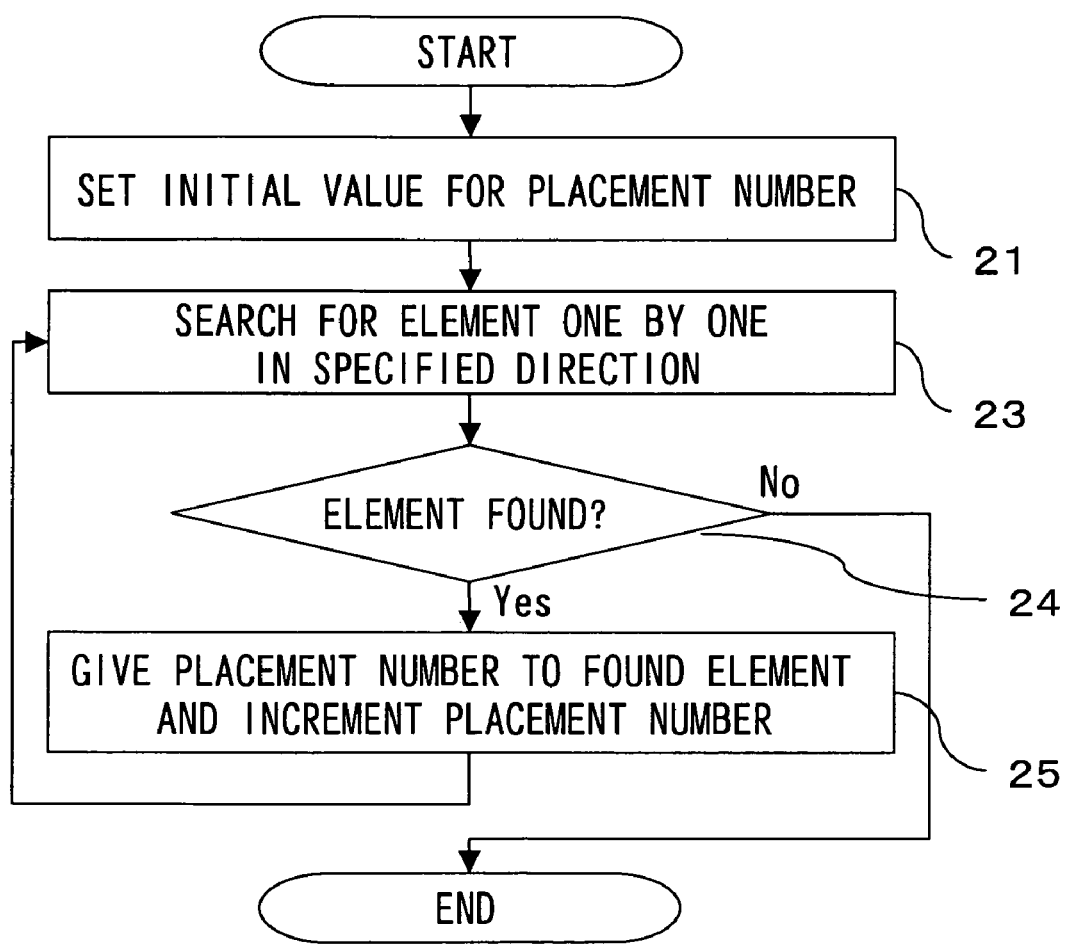
FIG. 2 is a flowchart showing processing by means for determining relative cell placement order in the first embodiment of the present invention.

FIG. 2 is a flowchart showing details of processing steps of the means for determining relative cell placement order 12 of FIG. 1. A design method according to the present embodiment will be described using FIG. 1 and the flowchart in FIG. 2. The processing shown in FIG. 2 is implemented by a program to be executed by a computer constituting the automatic layout design apparatus for a semiconductor integrated circuit.

An placement number is set to an initial value (at step 21). The initial value is set to one.

A device is searched for in a specified direction with respect to the circuit diagram information (at step 23). The search is performed by checking existence of the device in a vertical direction or a lateral direction. In the present embodiment, a region in the circuit diagram information in FIG. 3 is automatically divided in the vertical direction by a width set in advance (set by the circuit designer, for example), and whether the device is present or not is searched from a left end region 46 to a right end region 48. For the automated division of the region, a method of the division in the lateral direction, oblique direction or according to other rule as well as in the vertical direction can be applied. The width set in the vertical direction in advance may also be set automatically.

Figure 4:
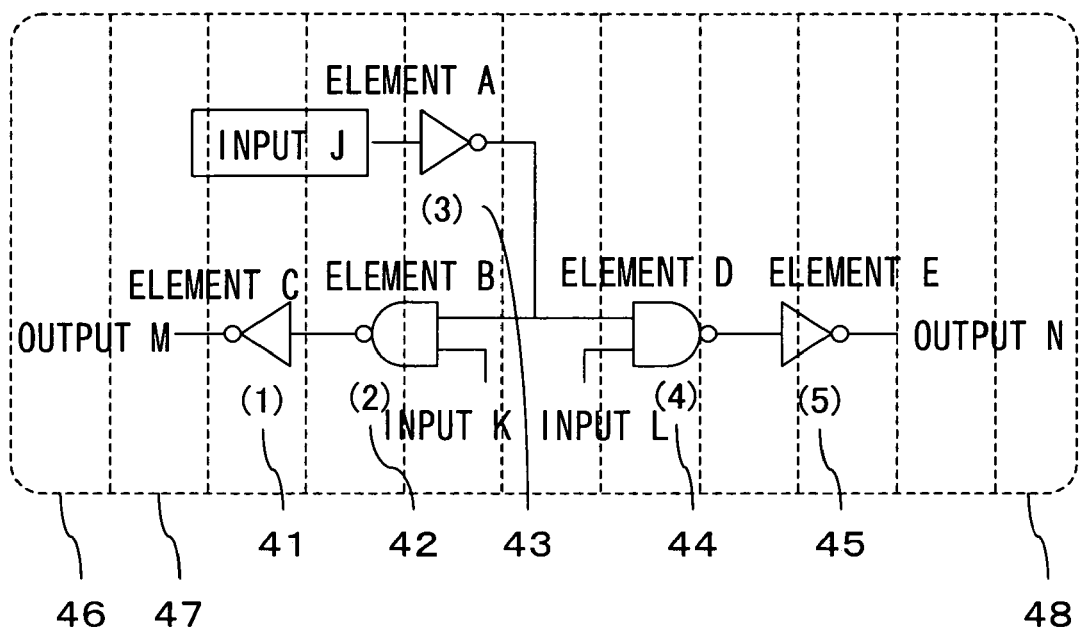
FIG. 4 shows circuit diagram information in a stage in which the processing by the unit for determining relative cell placement order in the first embodiment of the present invention has been finished.

Referring to FIG. 4, reference numerals 46 to 48 indicate regions in which the means for automatically determining relative cell placement order 12 in FIG. 1 searches for an element. Reference numerals 41 to 45 indicate the placement orders (1) to (5) automatically determined by the means 12.

When an element is found within the region subjected to the search by the means for automatically determining relative cell placement order 12 in FIG. 1 (to YES branching at step 24), the means for automatically determining relative cell placement order 12 gives a cell placement number to the region, and at the same time, increments the placement number (at step 25). In the region 41 in FIG. 4, the element C is found. Thus, the means for automatically determining relative cell placement order 12 gives the cell placement number of one to the region 41, and increments the placement number by one to two. Since the element B is found in the region 42, the means for automatically determining relative cell placement order 12 gives the cell placement number of two to the region 42, and increments the placement number by one to three. Since the element A is found in the region 43, the means for automatically determining relative cell placement order 12 gives the cell placement number of three to the region 43, and increments the placement number by one to four. Since the element D is found in the region 44, the means for automatically determining relative cell placement order 12 gives the cell placement number of four to the region 44, and increments the placement number by one to five. Since the element E is found in the region 45, the means for automatically determining relative cell placement order 12 gives the cell placement number of five to the region 45, and increments the placement number by one to six.

When the search for all the elements in the circuit diagram information has been finished (to NO branching at step 24), processing by the means for automatically determining cell placement order 12 is finished. At this point, the circuit diagram information becomes a state in which the relative placement orders of the cells are given, as shown in the regions 41 to 45 in FIG. 4. FIG. 4 shows the circuit diagram information in a stage in which the processing by the means for determining relative cell placement order 12 in FIG. 1 has been finished. The numbers '1' to '5' are given to a plurality of (five) cells C, B, A, D, and E, respectively. Automated placement of the cells is performed from this state, according to the relative placement orders given to the circuit diagram information. As a result, a cell placement order becomes an placement as shown in FIG. 5 the circuit designer considered to be optimal, so that the design in which the timings have been optimized becomes possible. A path 31 and the paths 32 and 33 in FIG. 3 correspond to paths 51, 52, and 53 in FIG. 5, respectively.

Next, a second embodiment of the present invention will be described. The present embodiment is different from the embodiment described before in that in the present embodiment, a priority frame featuring the placement order is employed. A design method according to the present embodiment is in accordance with FIG. 1, as in the first embodiment.

Figure 6:
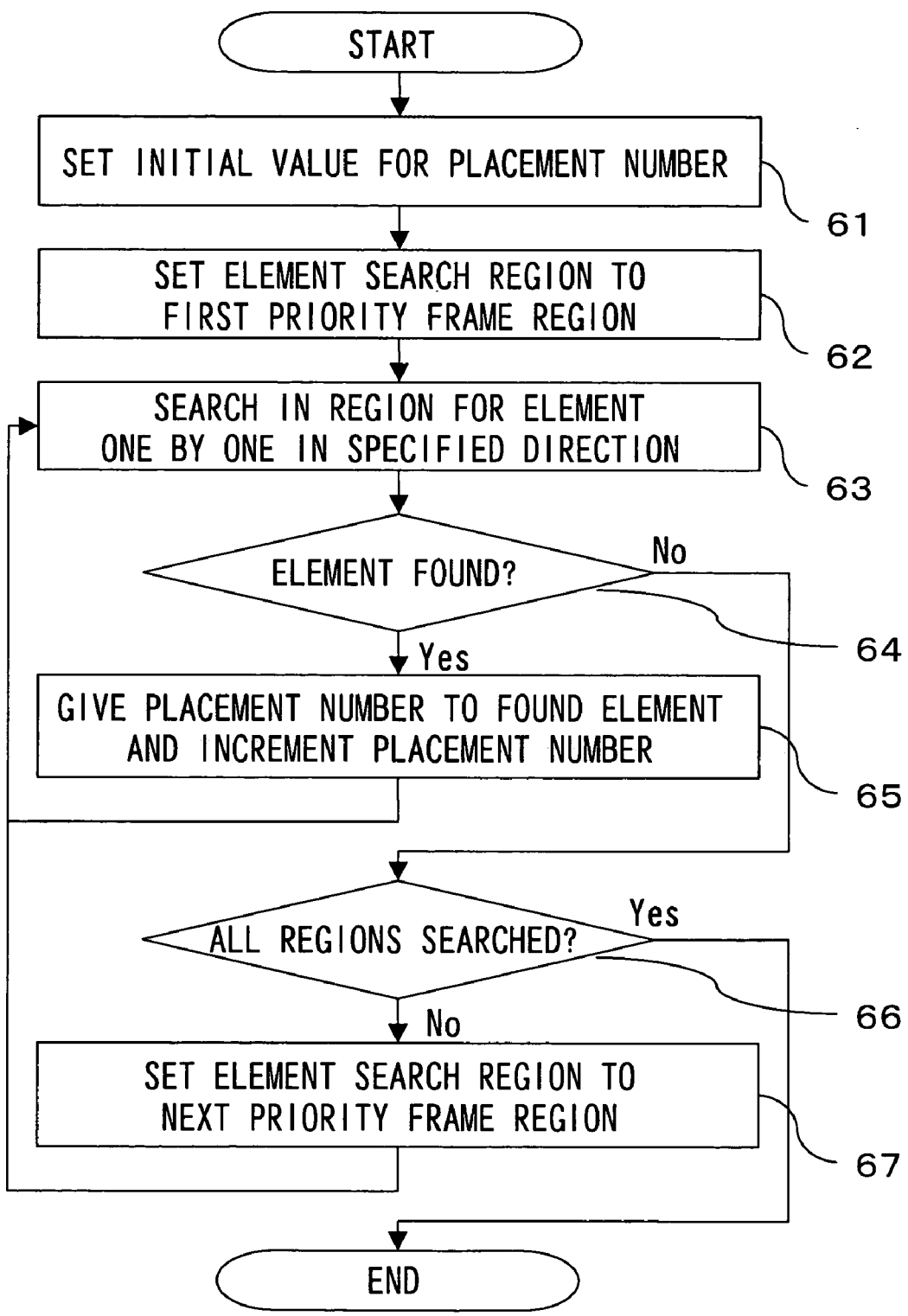
FIG. 6 is a flowchart showing processing by the unit for determining relative cell placement order in a second embodiment of the present invention.

FIG. 6 is a flowchart showing means by the means for determining relative cell placement order 12 in the present embodiment in detail. At processing steps in the present embodiment, the priority frame is employed for designing, which is a difference from the first embodiment described before. Processing in FIG. 6 is implemented by a program to be executed by the computer that constitutes the automatic layout design apparatus of the semiconductor integrated circuit.

Figure 7:
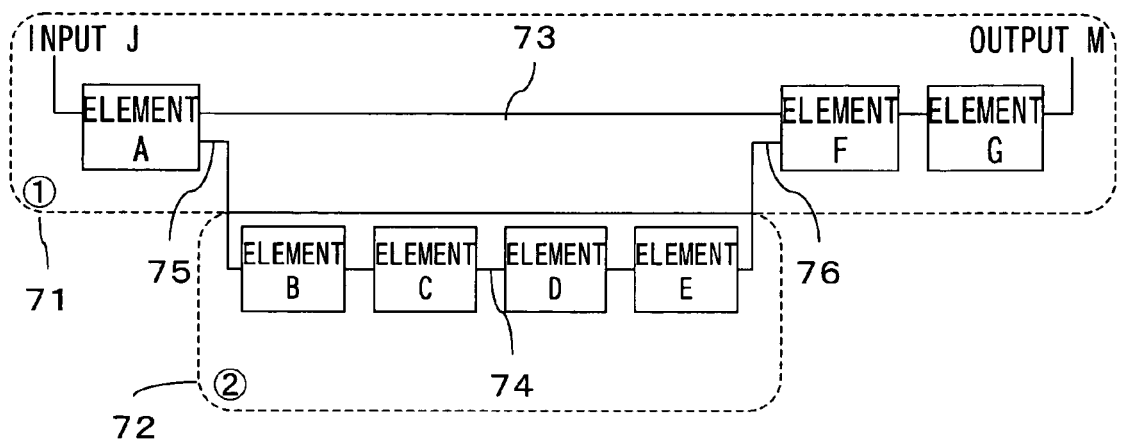
FIG. 7 shows circuit diagram information for explaining the second embodiment of the present invention.

FIG. 7 shows circuit diagram information for explaining the present embodiment. Reference numeral 71 indicates a first priority frame, reference numeral 72 indicates a second priority frame, reference numeral 73 indicates a critical path, the speed of which is needed to be the fastest, and reference numeral 74 indicates a delay path that causes no problem even if an interconnection length thereof gets longer in some degree. Reference numeral 75 indicates an input path to the delay, and reference numeral 76 indicates an output path from the delay path. As the circuit diagram information in FIG. 1, the circuit diagram information as shown in FIG. 7 is designed, and the priority frames 71 and 72 are set. This circuit is characterized in that it is the circuit in which the total interconnection length of the critical path 73 needs to be reduced as much as possible, but even though the interconnection length of the delay path 74 gets longer in some degree, it presents no problem.

Then, this circuit is divided into the two regions (priority frames) 71 and 72, and interconnection lengths of input/output portions to/from the delay paths 75 and 76 that establish connection between these regions are increased, thereby assembling the critical path 73 and the delay path 74, for cell placement. This becomes the design that optimizes the timings most. Then, the first priority frame 71 and the second priority frame 72 are set in the circuit diagram information.

Referring to FIG. 6, the placement number is set to the initial value (at step 61). The initial value is set to one in the present embodiment.

Next, an element research region is set to the priority frame with the highest priority level of the priority frames set in the circuit diagram information (at step 62).

First, the search for element is performed on the region of the first priority frame (at step 63). In the present embodiment, as in the embodiment described before, the region is divided in the vertical direction, and the search is performed from a resulting region on the left side to a resulting region on the right side to find whether an element is present.

When the element is found within the region subjected to the search (in the case of YES branching at step 64), the cell placement number is given, and the placement number is incremented (at step 65).

When the search for all elements within the region subjected to the search has been finished (in the case of NO branching at step 64), the operation proceeds to step 66.

When the search on all the regions of the priority frames has not been performed (in the case of NO branching at step 66), a search region number is incremented according to the priority level of the region set in advance, and the search is resumed on the next research region from step 63.

Figure 8:
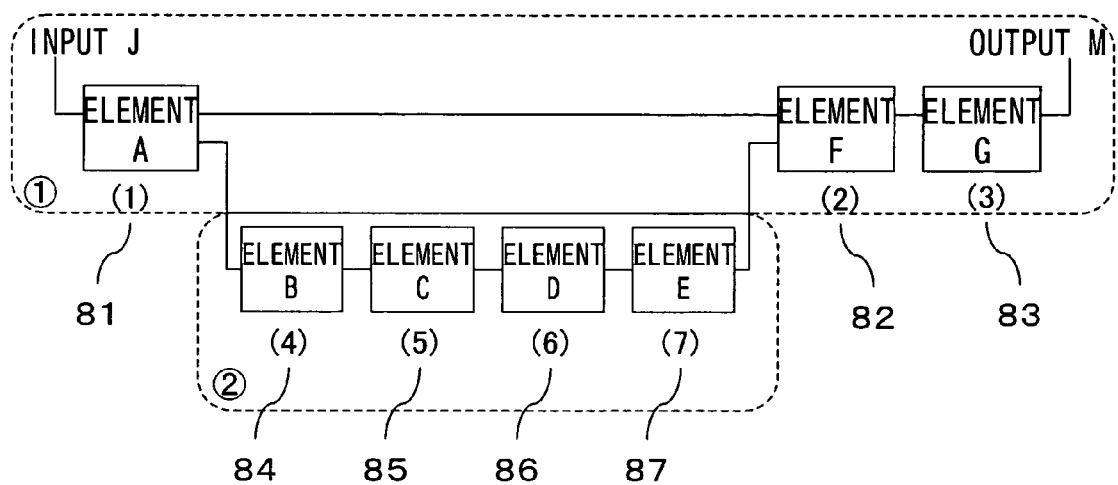
FIG. 8 shows circuit diagram information in a stage in which the processing by the unit for determining relative cell placement order in the second embodiment of the present invention has been finished.

When the search on all the regions has been finished (in the case of YES branching at step 66), processing by the means for automatically determining cell placement order 12 is finished. At this point, the circuit diagram information becomes the state in which the relative placement orders of cells are given, as indicated by reference numerals 81 to 87 in FIG. 8. Just by viewing this circuit diagram information, the placement positions of the cells can be readily anticipated. FIG. 8 shows the circuit diagram information processed by the means 12 in FIG. 1. Reference numerals 81 to 87 show placement orders automatically determined by the means 12 described before. The placement orders '1', '2', and '3' are given to the element A and elements F, G in the region (of priority frame) 71, respectively, while the placement orders '4', '5', '6', and '7' are given to the elements B, C, D, and E in the region (of priority frame) 72, respectively.

Figure 9:
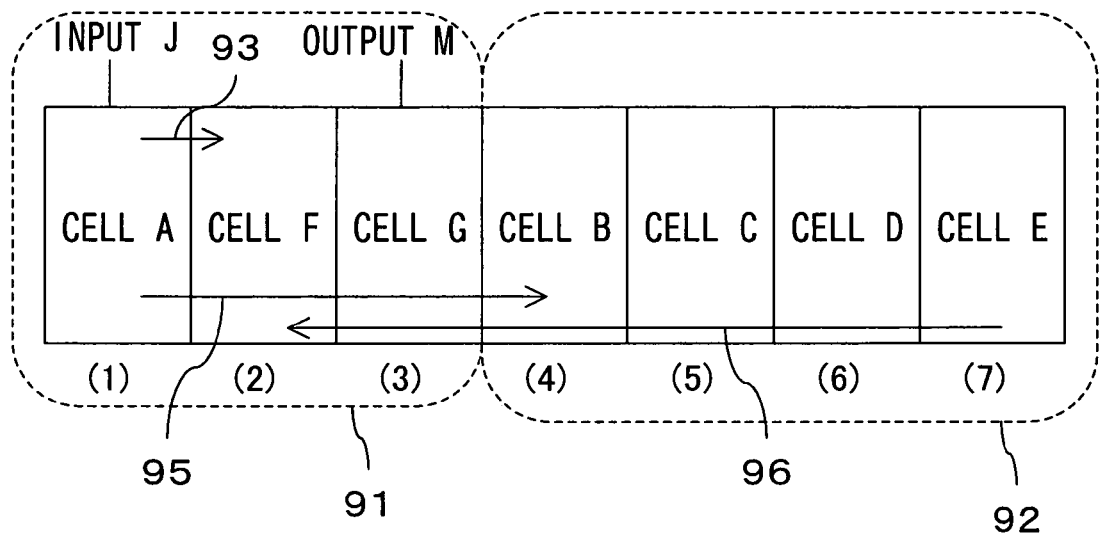
FIG. 9 is a diagram showing a result in which cells have been automatically placed based on the circuit diagram information in FIG. 7 in the second embodiment of the present invention.

Then, when the cells are arranged (arranged from the left to the right in the order of the placement orders one to seven) according to the relative placement orders automatically given to the circuit diagram information, the critical path 73 in FIG. 7 is arranged as shown in an arrow indicated by reference numeral 93 in FIG. 9. The interconnection length of the critical path 73 can be thereby reduced to a minimum. FIG. 9 shows the placement orders of the cells where the quality of the circuit has been optimized, which is the design goal set by the circuit designer, and also shows a result in which the cells have been automatically placed according to the present invention, based on the circuit diagram information in FIG. 7.

Further, the input 75 and the output 76 to/from the delay path in FIG. 7 are arranged as the cells that give no influence on the critical path as shown in arrows indicated by reference numerals 95 and 96 in FIG. 9, respectively. Thus, the final cell placement order becomes the placement considered by the circuit designer to be optimal, the design in which the timings have been optimized becomes possible.

Figure 10:
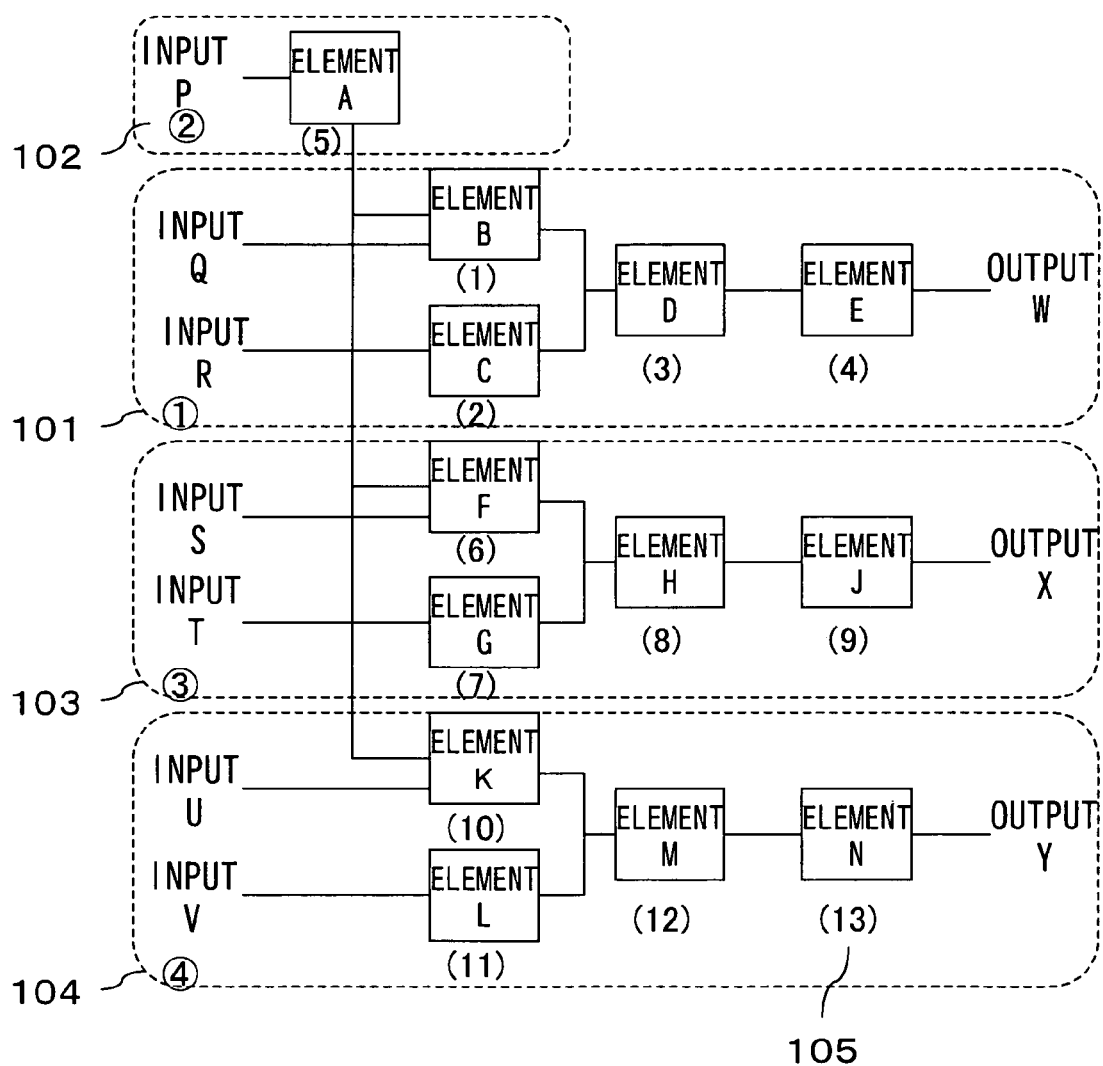
FIG. 10 shows circuit diagram information for explaining a third embodiment of the present invention.
Figure 11:
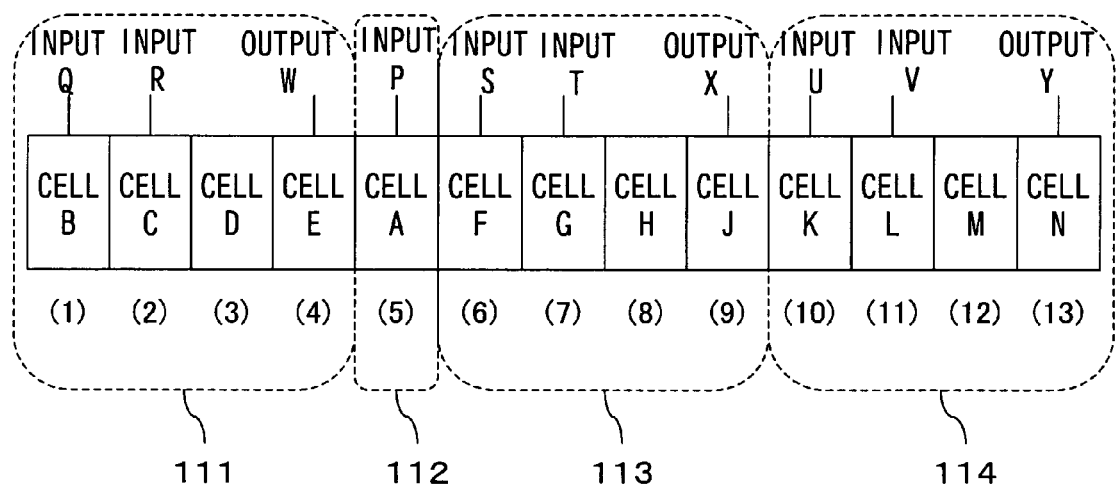
FIG. 11 is a diagram showing a result in which cells have been automatically placed based on the circuit diagram information in FIG. 10 in the third embodiment of the present invention.

Next, a third embodiment of the present invention will be described. A design method according to the present embodiment is the same as that in the second embodiment described with reference to FIGS. 1 and 6. FIG. 10 shows circuit diagram information showing the present embodiment. Reference numeral 101 denotes a first priority frame, reference numeral 102 denotes a second priority frame, reference numeral 103 denotes a third priority frame, and reference numeral 104 denotes a fourth priority frame. FIG. 11 shows a cell placement order where the circuit quality has been optimized, which is the design goal set by the circuit designer. FIG. 11 also shows a result in which cells have been automatically placed according to the present embodiment, based on the circuit diagram information in FIG. 10.

Next, the design method according to the present embodiment will be described, using FIG. 1 and the flowchart in FIG. 6.

As the circuit diagram information 11 in FIG. 1, the circuit diagram information as shown in FIG. 10 is designed, and the priority frames 101 to 104 are set. This circuit is characterized in that reference numerals 101, 103, and 104 indicate circuits having the same characteristics. Accordingly, it is necessary to make the routing pattern of interconnections between the cells in the circuits 101, 103 and 104 uniform.

The means 12 in FIG. 1 automatically determines and gives the relative placement orders of the cells to the circuit diagram information 11, which is implemented by the steps shown in the flowchart in FIG. 6. Since these steps are the same as those in the second embodiment, their detailed descriptions will be omitted.

At the point when processing by the means for automatically determining relative cell placement order 12 in FIG. 1 has been completed, the circuit diagram information becomes the state in which the relative placement orders of the cells are given to all elements, as indicated by reference numeral 105 in FIG. 10. Just by viewing this circuit diagram information, the placement positions of the cells can be readily anticipated.

Then, the cells are arranged according to the relative placement orders automatically given to the circuit diagram information. The cell placement is so performed that the circuit 101 in FIG. 10 is placed in a location indicated by reference numeral 111 in FIG. 11, the circuit 102 is placed in a location indicated by reference numeral 112, the circuit 103 is placed in a location indicated by reference numeral 113, and the circuit 104 is placed in a location indicated by 114. Thus, the characteristics of the circuits 101, 103, and 104 become uniform, so that the optimized design can be implemented.

Next, a fourth embodiment of the present invention will be described with reference to FIGS. 1, 6, 12, and 13. Design steps in the fourth embodiment are the same as those in the before-mentioned second embodiment described with reference to FIGS. 1 and 6.

Figure 12:
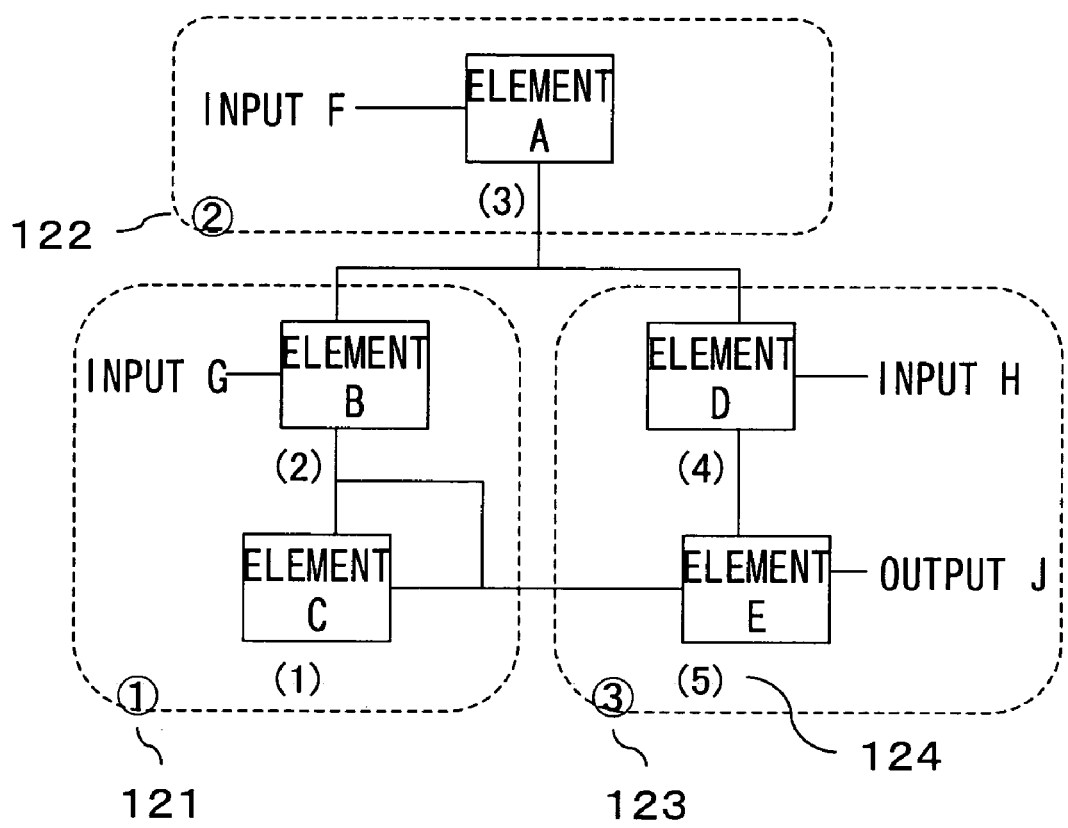
FIG. 12 shows circuit diagram information for explaining a fourth embodiment of the present invention.
Figure 13:
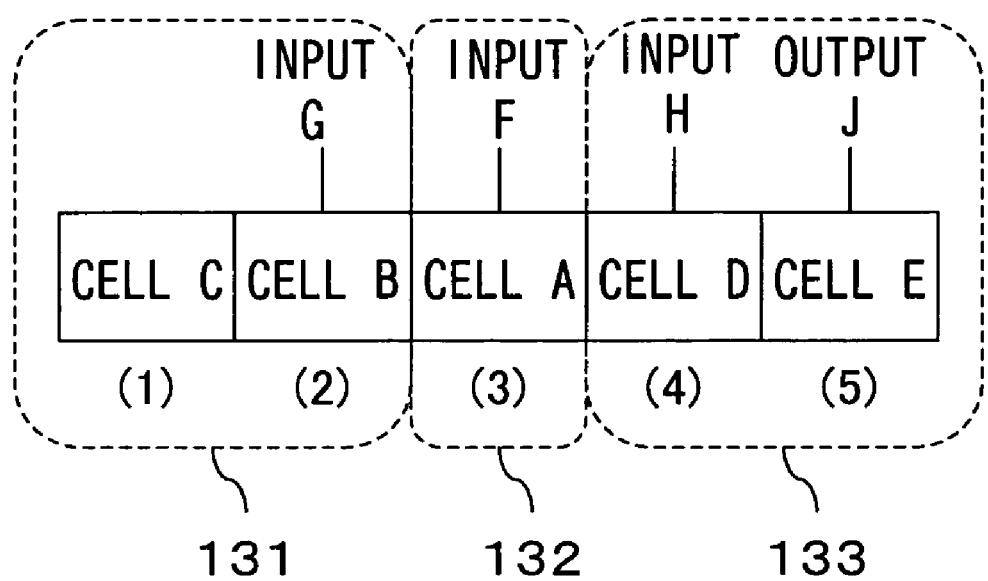
FIG. 13 is a diagram showing a result in which cells have been automatically placed based on the circuit diagram information in FIG. 12 in the fourth embodiment of the present invention.

FIG. 12 shows circuit diagram information for explaining the present embodiment. Referring to FIG. 12, reference numerals 121 to 123 denote first to third priority frames, respectively. FIG. 13 shows a cell placement order where circuit quality has been optimized, which is the design goal set by the circuit designer. FIG. 13 also shows a result in which cells have been automatically placed according to the present embodiment, based on the circuit diagram information in FIG. 12.

A design method according to the present embodiment will be described using FIG. 1 and the flowchart in FIG. 6.

As the circuit diagram information 11 in FIG. 1, circuit diagram information shown in FIG. 12, is designed, and priority frames 121 to 123 are set. This circuit is characterized in that in order to make the priority frames 121 and 123 to have characteristics that are symmetrical with respect to the priority frame 122, cell placement in the priority frames 121 and 123 needs to be symmetrical.

The means for automatically determining relative cell placement order 12 in FIG. 1 gives the placement orders to the circuit diagram information 11 according to the steps shown in the flowchart in FIG. 6. Since these steps are the same as those in the second embodiment, their detailed descriptions will be omitted.

At the point when the processing by the means for automatically determining relative cell placement order 12 in FIG. 1 has been completed, the circuit diagram information becomes the state in which the relative placement orders of the cells are given to all the elements, as indicated by reference numeral 124 in FIG. 12. Just by viewing this circuit diagram information, the placement positions of the cells can be readily anticipated.

Then, when the cells are arranged according to the relative placement orders automatically given to the circuit diagram information, cell placement is so performed that from the priority frames 121 to 123 in FIG. 12 are placed in locations indicated by reference numerals 131 to 133 in FIG. 13, respectively. The cells corresponding to the priority frames 121 and 123 in FIG. 12 can be symmetrically arranged, so that optimization of the characteristics can be implemented.

Next, a fifth embodiment of the present invention will be described with reference to FIGS. 1 and 6, and FIGS. 14 to 16. A design method according to the present embodiment is the same as that in the second embodiment, shown in FIGS. 1 and 6.

Figure 14:
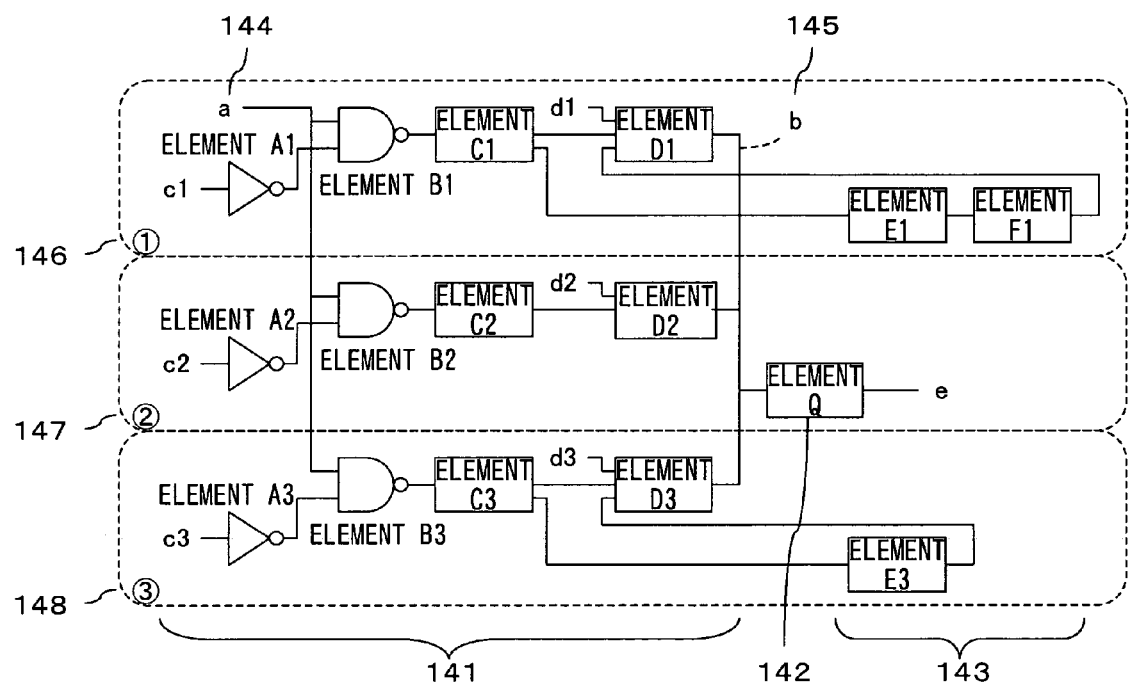
FIG. 14 shows circuit diagram information for explaining a fifth embodiment of the present invention.

FIG. 14 shows circuit diagram information for explaining the present embodiment. Referring to FIG. 14, reference numerals 141 to 143 show circuit portions having mutually different features. Reference numerals 144 and 145 indicate specific interconnections, while reference numerals 146 to 148 indicate first to third priority frames.

Figure 15:
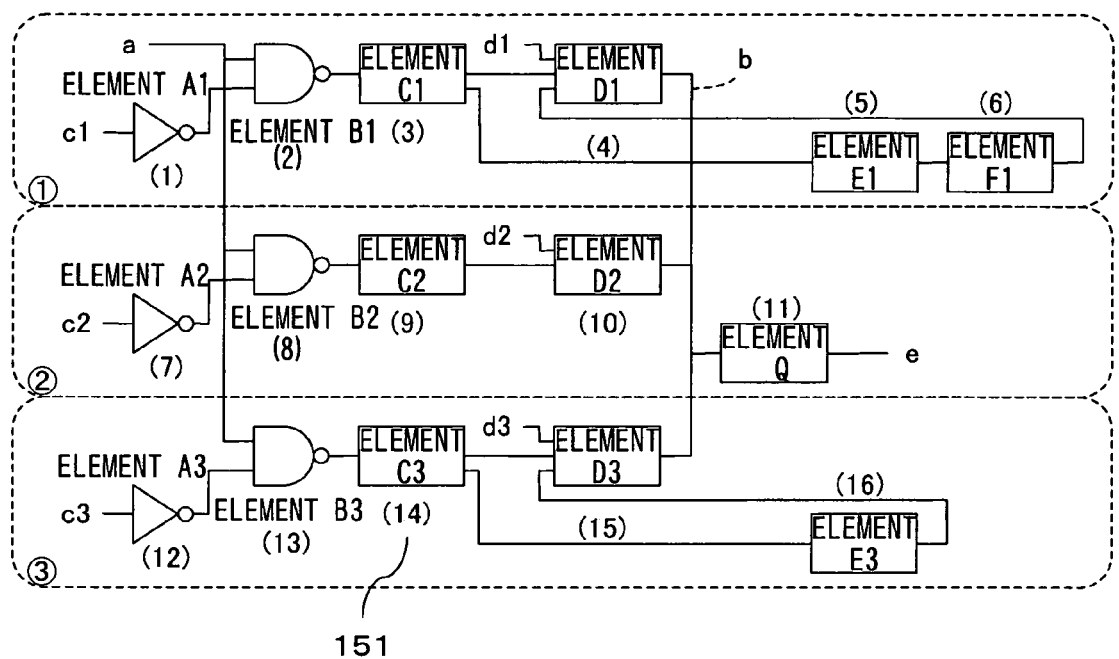
FIG. 15 is a diagram showing a result in which cells have been automatically placed based on the circuit diagram information in FIG. 14 in the fifth embodiment of the present invention.
Figure 16:
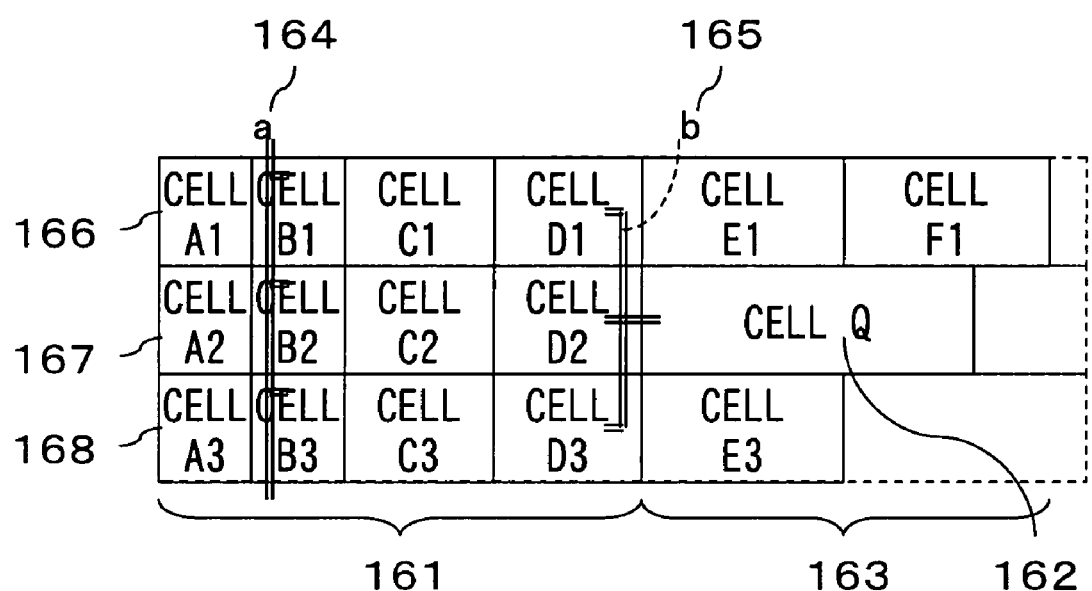
FIG. 16 is a diagram showing a result in which cells have been automatically placed based on the circuit diagram information in FIG. 14 in the fifth embodiment of the present invention.
Figure 17:
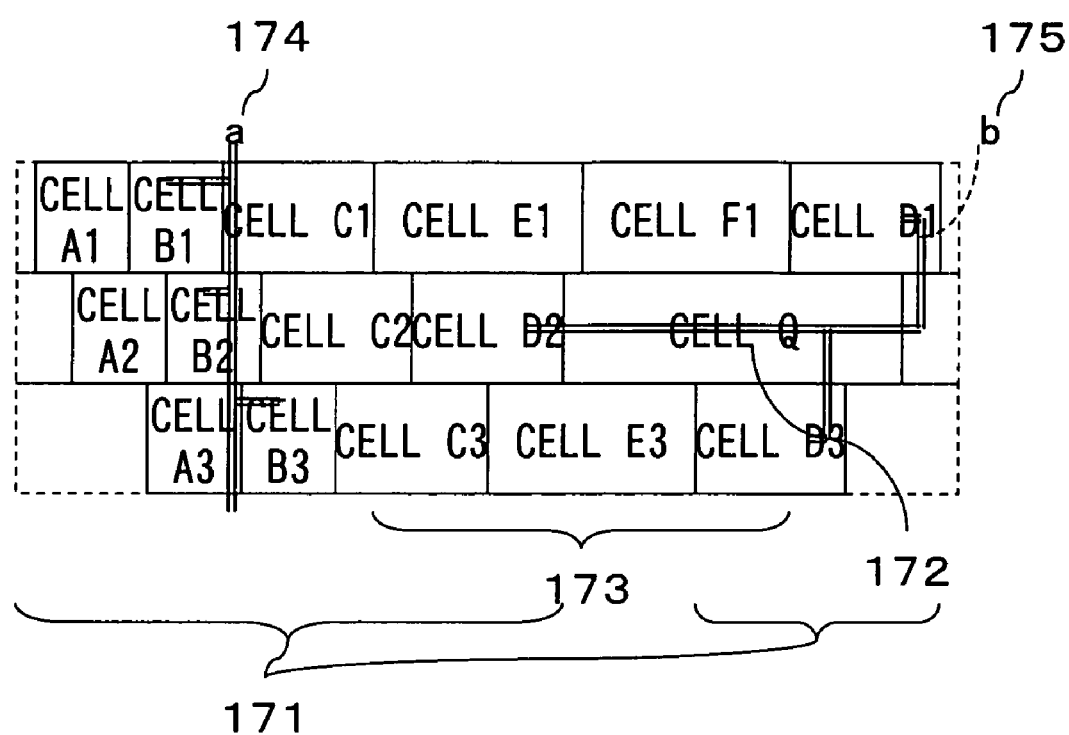
FIG. 17 is a diagram showing an example of cell placement using an algorithm of a standard-cell method that reduces a total interconnection length.

FIG. 15 shows circuit diagram information processed by the means for automatically determining relative cell placement order 12 in FIG. 1, and shows that the placement orders automatically determined by the means 12 have been determined for all elements, as indicated by reference numeral 151. FIG. 16 shows a cell placement order where the circuit quality has been optimized, which is the design goal set by the circuit designer. FIG. 16 also shows a result in which cells have been automatically placed according to the present invention, based on the circuit diagram information in FIG. 14.

A design method according to the present embodiment will be described using FIG. 1 and the flowchart in FIG. 6.

As the circuit diagram information 11 in FIG. 1, the circuit diagram information as shown in FIG. 14 is designed, and the priority frames 146 to 148 are set. This circuit is characterized in that in the portion 141, cell placement that gives the same characteristics to three circuits is necessary, cell placement for an element Q in the portion 142 needs to be so performed that the element Q is located in a position close to all of elements D1, D2, and D3 in the portion 141, and the portion 143 may be arranged in a position with lower priority than the positions of other cells since the portion 143 is the circuit that has a margin of the characteristics thereof.

The means for automatically determining relative cell placement order 12 in FIG. 1 gives the relative placement orders of the cells to the circuit diagram information 11 according to the steps shown in the flowchart in FIG. 6. Since these steps are the same as those in the second embodiment, their detailed descriptions will be omitted.

At the point when the processing by the means for automatically determining relative cell placement order 12 in FIG. 1 has been finished, the circuit diagram information becomes the state in which the relative placement orders of the cells are given to all elements, as indicated by reference numeral 151. Just by viewing this circuit diagram information, the placement positions of the cells can be readily anticipated.

Then, the cells are arranged according to the relative placement orders automatically given to the circuit diagram information. Unlike in the first through fourth embodiments, the cells are not arranged aligned on a line, in the fifth embodiment. An algorithm is applied in which the number of stages (rows) for cell placement is changed by one when a change in the priority frames is made. The cells can be thereby automatically placed in three stages (rows), as shown in FIG. 16. As a result, the priority frames 146 to 148 in FIG. 14 are arranged in locations indicated by reference numerals 166 to 168 in FIG. 16, respectively. In the portion 141 in FIG. 14, cell placement can be so performed that the three circuits have the same cell placement shape, as in a portion indicated by reference numeral 161 in FIG. 16. Further, with regard to the element Q in the portion 142 and the elements D1, D2, and D3 in the portion 141 in FIG. 14 as well, all the cells can be arranged in close positions as shown in the portion 161, and a portion 162 in FIG. 16. Thus, an interconnection b indicated by reference numeral 145 in FIG. 14 can also be wired to be the shortest, as in an interconnection indicated by reference numeral 165 in FIG. 16.

The cells to be arranged in the portion 143 in FIG. 14 as well can be approached to the end of a cell region to be designed, as in a portion 163 in FIG. 16. As a result, they are so configured that the problems of preventing placement of other cell with high priority and preventing interconnection between cells will not arise.

In each of the embodiments described above, before actual cell placement, the relative positional relationship can be set and grasped by the circuit designer, so that occurrence of the problem that the cells are arranged in positions that were not intended by the circuit designer is avoided. The embodiments of the present invention described above have the following operations and effects.

As the operation and effect of the first embodiment of the present invention, design of a timing aligning circuit that needs supply of signals of the same speed to a plurality of input interconnections becomes possible. In the circuit as shown in FIG. 3, it is necessary to design the path 32 extending from the input J to the output M and the path 33 extending from the input J to the output N to operate at the completely same timings. In order to implement this, design is so performed that the lengths of the paths 32 and 33 become equal. In the present embodiment, cell placement can be optimized so that the length of the path 52 becomes equal to length of the path 53, as shown in FIG. 5.

As the operation and effect of the second embodiment of the present invention, design that separates a critical path from unimportant paths becomes possible. The critical path refers to the path for which a speed needs to be the fastest, and for which it is necessary to arrange cells to be adjacent to each other, reduce an interconnection for establishing connection between the cells to the shortest, and reduce an interconnection resistance and an interconnection capacitance as much as possible. In the circuit shown in FIG. 7, reference numeral 73 denotes the critical path. Reference numeral 74 denotes the path that is less important than the path 73. It presents no problem if the interconnections 75 and 76 have resistances and capacitances to a certain degree, and it is necessary to design the path 73 for preference. In the present embodiment, a critical path region 91 is separated from an unimportant region 92, and the cells are arranged adjacent to each other, as shown in FIG. 9, as a result of which optimized circuit design can be implemented.

As the operation and effect of the third embodiment of the present invention, a group of circuits to which the same characteristics are needed to given, such as memory input and output circuits, can be designed at a time. In the circuit shown in FIG. 10, reference numerals 101, 103, and 104 denote the circuits having the same characteristics. In order to design the circuits to have the same characteristics, it is the most effective to make routing pattern of interconnection between cells 101, 103 and 104 in the circuits uniform. In the present invention, cell placement in the circuits 101, 103, and 104 in FIG. 10 can be performed in a positional relationship among the locations 111, 113, and 114 in FIG. 11. Thus, optimization of the characteristics can be implemented.

As the operation and effect of the fourth embodiment of the present invention, a circuit such as an amplifier circuit, in which symmetrical characteristics are needed to be given can be designed. FIG. 12 shows an example of the circuit of this kind. In the priority frames 121 and 123, symmetrical cell placement and interconnection are needed to so as to give symmetrical characteristics. In the present invention, cell placement can be performed as shown in FIG. 13. Thus, by arranging the priority frames 121 and 123 in FIG. 12 in the locations 131 and 133 in FIG. 13, design in which the characteristics of the circuit have been optimized can be implemented.

As the operation and effect of the fifth embodiment of the present invention, even in a complex circuit obtained by combining circuits from the first through fourth embodiments and which could not be designed by automated cell placement by a conventional art, by applying the present invention, separation of the critical path from the unimportance paths, cell placement suitable for a plurality of circuits to which the same characteristics are to be given, and the cell placement that can optimize interconnection shapes after the cell placement can be all specified at the time of preparation of the circuit diagram information. Automated cell placement can also be completed in an optimized shape at one time.

Next, as a sixth embodiment of the present invention, the embodiment combined with an automated placement algorithm of the standard-cell method will be described.

Figure 18:
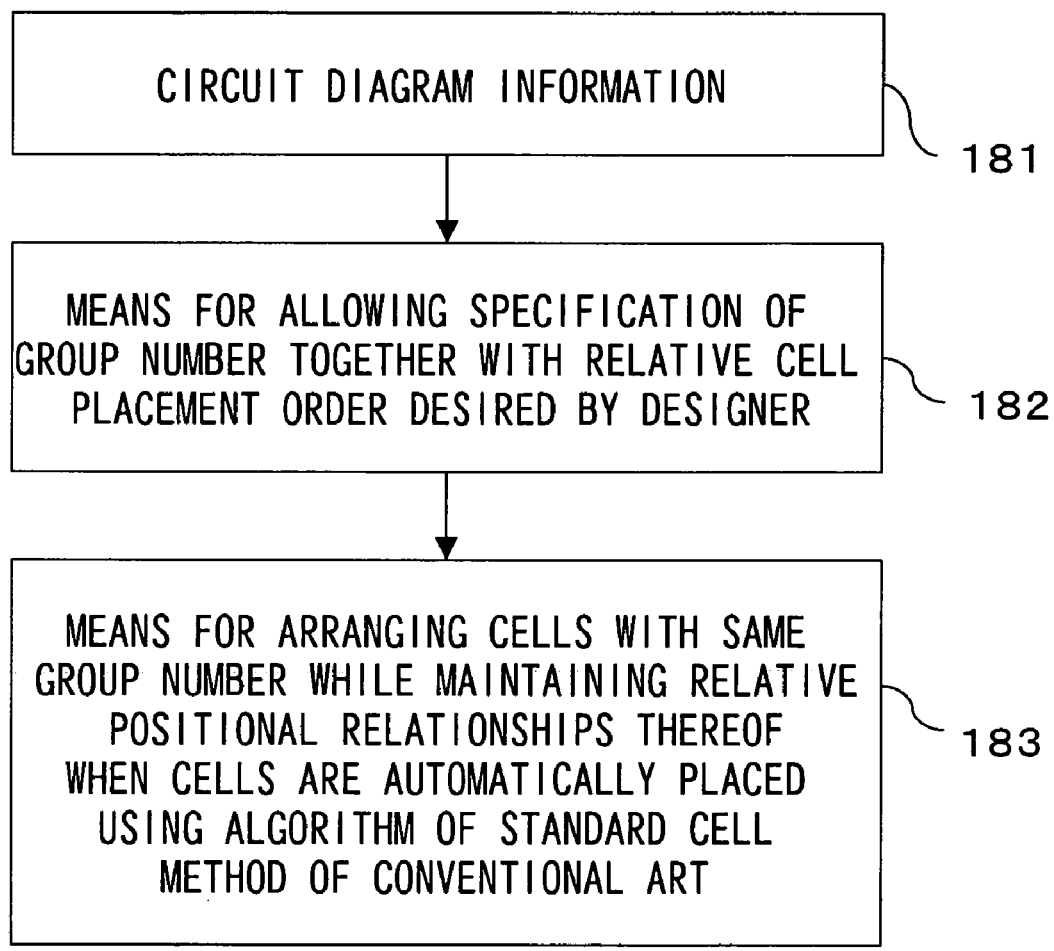
FIG. 18 is a diagram for explaining a configuration of a sixth embodiment of the present invention.
Figure 19:
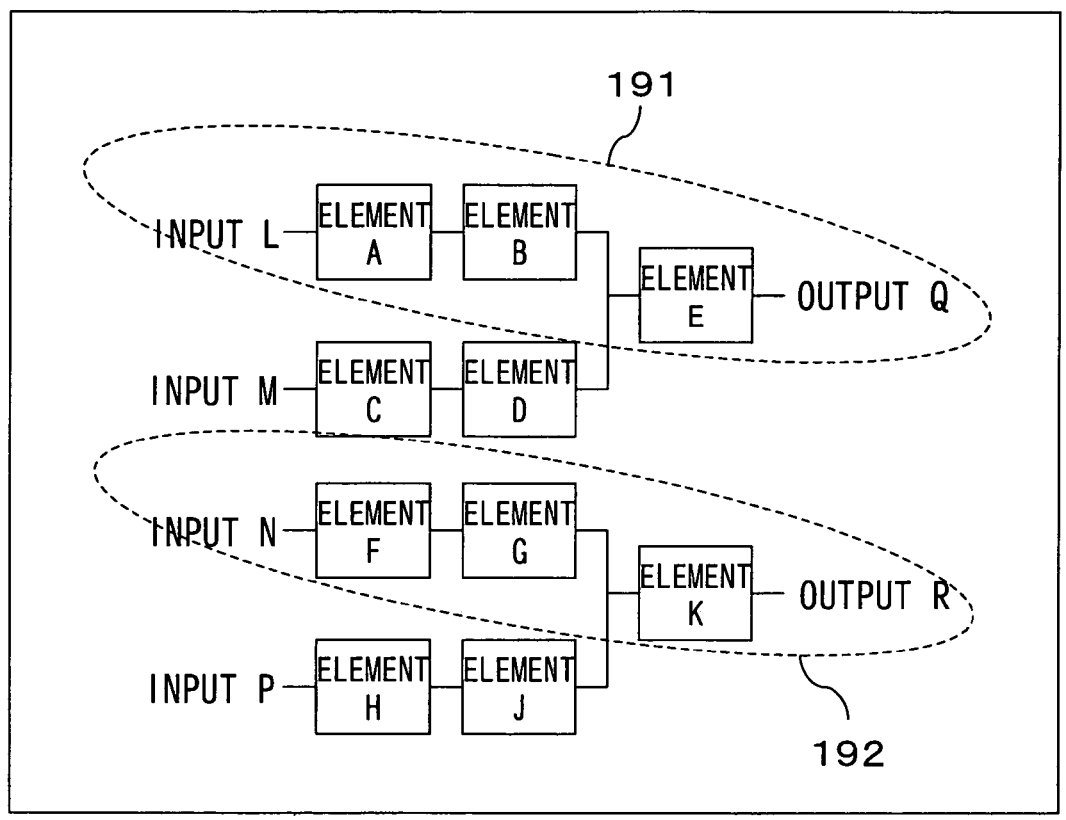
FIG. 19 shows circuit diagram information for explaining the sixth embodiment of the present invention.

FIG. 18 shows a design method according to the present embodiment. Referring to FIG. 18, reference numeral 181 denotes circuit diagram information. FIG. 19, for example, shows the circuit diagram information corresponding to this. Paths 191 and 192 are critical paths, so that cells therefore are needed to be continuously arranged adjacent to each another.

Other elements are on paths that are not so important, so that special consideration need not be given to cell placement positions.

Reference numeral 182 denotes means for specifying the relative placement order of a cell for an element alone for which the cell placement order is needed to be specified as a result of consideration of the circuit quality by the designer with respect to the circuit diagram information 181. A difference from the embodiments described before is that the placement orders are not specified for all elements, but are specified for the necessary elements alone associated with the critical paths. Further, not only the placement orders are specified, but also the same group number is given to the elements connected to each other.

Figure 20:
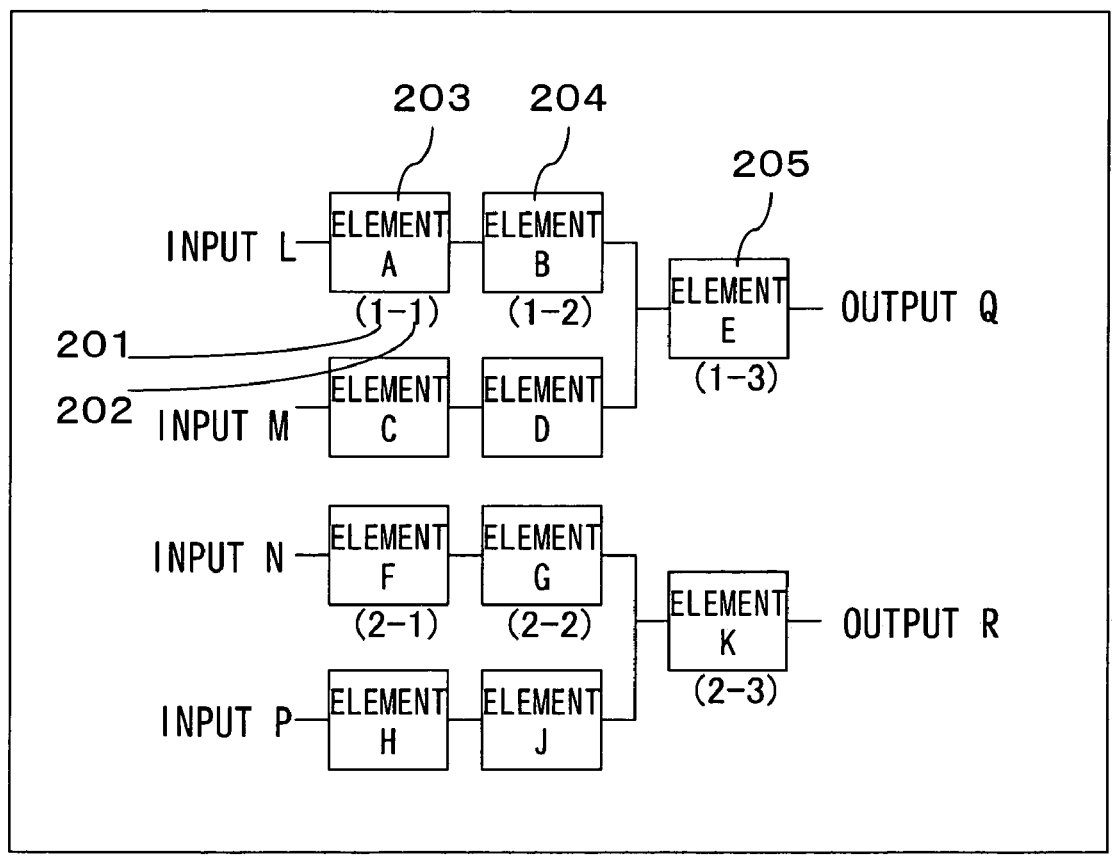
FIG. 20 is a diagram specifying placement orders and group numbers according to the sixth embodiment of the present invention.

FIG. 20 is obtained by specifying the placement orders and group numbers to the circuit diagram information in FIG. 19. Reference numeral 201 denotes the group number, and reference numeral 202 denotes the relative cell placement order.

Reference numeral 183 denotes means for performing automated cell placement according to the algorithm of the standard-cell method. When a cell with the group number thereof specified is arranged, all cells with that group number are arranged with the relative cell placement orders thereof specified by the means 182 maintained. When the cell corresponding to an element 203 in FIG. 20 is arranged, cells corresponding to elements 204 and 205 with the same group number are continuously arranged according to the cell placement orders specified by the means 182.

Figure 21:
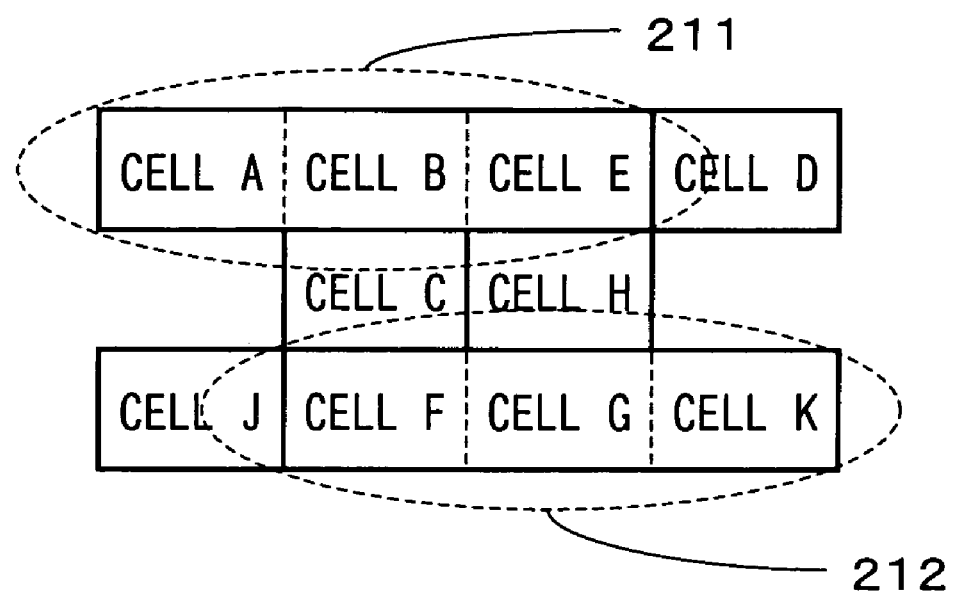
FIG. 21 is a diagram showing a result in which cells have been automatically placed based on the circuit diagram information in FIG. 19 in the sixth embodiment of the present invention.

As a result, the cell placement order becomes the order as shown in FIG. 21, which the circuit designer considers to be optimal. The critical path 191 in FIG. 19 is placed in a location 211 in FIG. 21, while the critical path 192 in FIG. 19 is placed in a location 212 in FIG. 21. A desired placement order is thus kept.

The foregoing description was directed to the design methods of a semiconductor element According to the present invention. By implementing processing of the design method described above (processing shown in FIGS. 1, 2, 6, 18, or the like) using a program to be executed by a computer not shown, the electronic automatic design apparatus of a semiconductor integrated circuit can be provided.

The foregoing description was given in conjunction with the embodiments described above. The present invention, however, is not limited to configurations of the embodiments described above, and of course includes various variations and modifications that could be made by those skilled in the art within the scope of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A method for circuit design of a semiconductor integrated circuit using a computer system, said method comprising:
   receiving circuit diagram information which comprises a plurality of elements;
   searching the elements of the circuit diagram information in a specific direction to find each of the elements;
   assigning a placement number to each of the elements each time when one of the elements is found by the searching, the placement numbers assigned to the elements being different from one another; and
   performing, by said computer system, automatic placement of cells corresponding respectively to the element so that relative positions of the cells are determined in accordance with an order represented by the placement numbers.

2. The method according to claim 1, wherein:
   when assigning the placement order to the cell, search for an element of the circuit diagram is performed for each of a plurality of regions obtained by division of the circuit diagram information in a specified direction with respect to the circuit diagram information. and a placement number of the cell is assigned when the element is found;
   when assigning the placement order to the cell, priority frames set in the circuit diagram information are used. and the placement order of the cell is assigned in an order of priority of said priority frames;
   when assigning the placement order, placement numbers from a current placement number to the current number plus m are given to first through mth cells, respectively, corresponding to m elements within each of said priority frames, where m is a positive integer;
   said method further comprising:
   changing a number of cell rows for cell placement when said priority frames given to the circuit diagram information are changed.

3. The method according to claim 1, wherein the searching comprises dividing the circuit diagram information into a plurality of regions, and scanning each of the regions in the specific direction to find each of the elements.

4. The method according to claim 3, wherein the circuit diagram information further comprises a plurality of priority frames each containing one or more of the elements, the priority frames being used to assign the placement number to each of the elements from a highest order element of the priority frames to a lowest order element thereof.

5. The method according to claim 4, wherein a priority of one of said priority frames for a region including a critical path is set to be higher than a priority of a region not including said critical path.

6. The method according to claim 5, wherein the circuit diagram information includes a configuration for supplying a signal to a plurality of circuit blocks in common from another one of the circuit blocks; and
   the priority given to one of said priority frames including at least one circuit block among said plurality of circuit blocks and the priority given to one of said priority frames of said another one of the circuit blocks are set to mutually adjacent values.

7. A method for design of a semiconductor integrated circuit using a computer system, said method comprising:
   receiving circuit diagram information;
   assigning a placement order to a cell based on the circuit diagram information; and
   performing, by said computer system, automatic placement of the cell into a circuit design, wherein relative positions of a plurality of cells in the circuit design are determined in accordance with the placement order;
   wherein:
   when assigning the placement order to the cell, search for an element of the circuit diagram is performed for each of a plurality of regions obtained by division of the circuit diagram information in a specified direction with respect to the circuit diagram information, and a placement number of the cell is assigned when the element is found;

when assigning the placement order to the cell, priority frames set in the circuit diagram information are used, and the placement order of the cell is assigned in an order of priority of said priority frames;

when assigning the placement order, placement numbers from a current placement number to the current number plus m are given to first through mth cells, respectively, corresponding to m elements within each of said priority frames, where m is a positive integer; and when performing said automatic placement of the cell, said first through mth cells in said each of said priority frames are continuously arranged within a cell row.

8. A method for design of a semiconductor integrated circuit using a computer system, said method comprising:

receiving, by computer system, circuit diagram information;

assigning a placement order to a cell based on the circuit diagram information; and performing, by said computer system, automatic placement of the cell into a circuit design, wherein relative positions of the cells in the circuit design are determined in accordance with the placement order;

wherein:

when assigning the placement order to the cell, search for an element of the circuit diagram is performed for each of a plurality of regions obtained by division of the circuit diagram information in a specified direction with respect to the circuit diagram information, and a placement number of the cell is assigned when the element is found;

when assigning the placement order to the cell, priority frames set in the circuit diagram information are used, and the placement order of the cell is assigned in an order of priority of said priority frames;

the circuit diagram information includes a configuration for supplying a signal to a plurality of circuit blocks in common from other one circuit block; and the priority given to one of said priority frames including at least one circuit block among said plurality of circuit blocks and the priority given to one of said priority frames of said other one circuit block are set to mutually adjacent values;

said assigning is performed on all of priority frames, said assigning comprising:

setting an placement number to an initial value;

performing search for an element in a region of one of said priority frames set in the circuit diagram information in an order of priority of said one of said priority frames, the search is being performed from an end of a plurality of regions of the received circuit diagram information to an opposite end of said regions to see whether the element is present or not when the element is searched for in the circuit diagram information in a predetermined first direction, said regions being obtained by division of the received circuit diagram information by a preset width in a predetermined second direction with respect to the first direction; and assigning the placement number of the cell and incrementing the placement number when the element is found within one of said regions subjected to the search 9. An apparatus for circuit design of a semiconductor integrated circuit, said apparatus comprising:

means for receiving circuit diagram information which comprises a plurality of elements;

means for searching the elements of the circuit diagram information in a specific direction to find each of the elements;

means for assigning a placement number to each of the elements each time one of the elements is found by the searching, the placement numbers assigned to the elements being different from one another; and means for performing automatic placement of cells corresponding respectively to the elements so that relative positions of the cells are determined in accordance with an order represented by the placement numbers;

wherein said apparatus comprises a processor and memory performing the function of at least one of said means for receiving, means for searching, means for assigning and means for performing.

10. A computer readable medium having computer instructions for enabling a computer executing the computer instructions to perform a method for circuit design of a semiconductor integrated circuit, said method comprising:

receiving circuit diagram information which comprises a plurality of elements;

searching the elements of the circuit diagram information in a specific direction to find each of the elements;

assigning a placement number to each of the elements each time one of the elements is found by the searching, the placement numbers assigned to the elements being different from one another; and performing, by said computer, automatic placement of cells corresponding respectively to the elements so that relative positions of the cells are determined in accordance with an order represented by the placement numbers.

* * * * *